United States Patent
Fu et al.

(10) Patent No.: US 7,834,576 B2
(45) Date of Patent: Nov. 16, 2010

(54) APPARATUS AND METHODS FOR DIAGNOSING MOTOR-RESOLVER SYSTEM FAULTS

(75) Inventors: David T Fu, Rochester, MI (US); Wei D. Wang, Troy, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 271 days.

(21) Appl. No.: 11/748,054

(22) Filed: May 14, 2007

(65) Prior Publication Data

US 2008/0284366 A1 Nov. 20, 2008

(51) Int. Cl.
G05B 1/06 (2006.01)

(52) U.S. Cl. .................. 318/661; 318/605; 318/652; 318/400.39

(58) Field of Classification Search ............ 318/490, 318/400.39, 605, 661, 560, 400.4, 628, 652, 318/700, 721; 702/108, 112, 121, 183, 185; 324/179, 500, 513, 523, 555, 750, 772, 76.11, 324/76.52; 341/112, 116, 147; 714/30, 46; 340/693.8, 825; 356/4.02; 73/865.3, 865.9; 370/241, 242, 244
See application file for complete search history.

(56) References Cited

U.S. PATENT DOCUMENTS

| | | | | |
|---|---|---|---|---|
| 3,737,885 A * | 6/1973 | Hedrick | ............ | 340/870.34 |
| 3,800,128 A * | 3/1974 | Kurk | ............ | 701/21 |
| 3,819,162 A * | 6/1974 | Inomata et al. | ............ | 266/68 |
| 4,355,305 A * | 10/1982 | Cording et al. | ............ | 341/115 |
| 4,467,320 A * | 8/1984 | McPhee | ............ | 341/115 |
| 4,740,778 A * | 4/1988 | Harding et al. | ............ | 340/635 |
| 4,762,007 A * | 8/1988 | Gasperi et al. | ............ | 73/862.326 |
| 4,884,016 A * | 11/1989 | Aiello | ............ | 318/685 |
| 5,103,404 A * | 4/1992 | McIntosh | ............ | 318/568.22 |
| 5,451,945 A * | 9/1995 | Alhorn et al. | ............ | 341/110 |
| 5,644,224 A * | 7/1997 | Howard | ............ | 324/165 |
| 6,255,794 B1 * | 7/2001 | Staebler | ............ | 318/605 |
| 6,278,389 B1 * | 8/2001 | Lochmann et al. | ............ | 341/118 |

(Continued)

FOREIGN PATENT DOCUMENTS

DE 3920791 A1 1/1991

OTHER PUBLICATIONS

Chinese Office Action issued on Jun. 9, 2010, for Application No. 200810100228.

*Primary Examiner*—Walter Benson
*Assistant Examiner*—Antony M Paul

(57) ABSTRACT

Apparatus and methods are provided for diagnosing faults in multiple, associated motor-resolver systems. One apparatus includes a swapping circuit coupling a first resolver to a first or second decoder, and a swapping circuit coupling a second resolver to the first or second decoder. One method includes applying a signal from a resolver to a first decoder to determine that the first decoder is malfunctioning if the first decoder continues to generate a fault signal, and applying a signal from a different resolver to a second decoder to determine that a motor associated with the first decoder is malfunctioning if the second decoder generates a fault signal. Another method includes transmitting a signal from a resolver to first and second decoders, transmitting a signal from a different resolver to the first and second decoders, and determining if the first decoder, second decoder, a first motor, or a second motor is malfunctioning.

19 Claims, 6 Drawing Sheets

U.S. PATENT DOCUMENTS

| | | | |
|---|---|---|---|
| 6,426,712 B1 * | 7/2002 | Hare et al. | 341/116 |
| 6,525,502 B1 * | 2/2003 | Piedl et al. | 318/605 |
| 6,803,781 B2 * | 10/2004 | Kobayashi et al. | 324/772 |
| 6,843,142 B2 * | 1/2005 | Nagase | 73/862.326 |
| 6,948,382 B2 * | 9/2005 | Sakai et al. | 73/862.326 |
| 6,972,700 B2 * | 12/2005 | Kanekawa et al. | 341/116 |
| 7,005,812 B2 * | 2/2006 | Mitchell | 318/400.04 |
| 7,123,175 B2 * | 10/2006 | Katakura et al. | 341/112 |
| 7,139,796 B2 * | 11/2006 | Rekimoto et al. | 709/204 |
| 7,149,615 B2 * | 12/2006 | Ura | 701/41 |
| 7,157,906 B2 * | 1/2007 | Miya | 324/207.25 |
| 7,462,999 B2 * | 12/2008 | Mitchell et al. | 318/490 |
| 7,557,340 B2 * | 7/2009 | Wong et al. | 250/231.13 |
| 2008/0278106 A1 | 11/2008 | Fu et al. | |

* cited by examiner

APPARATUS AND METHODS FOR DIAGNOSING MOTOR-RESOLVER SYSTEM FAULTS

FIELD OF THE INVENTION

The present invention generally relates to motor-resolver systems, and more particularly relates to apparatus and methods for diagnosing faults in multiple, associated motor-resolver systems.

BACKGROUND OF THE INVENTION

Motor-resolver systems are typically employed to accurately sense and control the position of rotating shafts. As a motor is employed to a resolver at a particular rate or rotational velocity, the output of the resolver is then fed to a motor controller to determine if the motor is properly driving the shafts. When a resolver anomaly is detected, the motor controller notifies the user with an error message (e.g., a visual warning, an audio warning, etc.).

Some devices (e.g., a hybrid vehicle) include multiple motors (and multiple resolvers) coupled to a single motor controller. In these devices, the motor controller often includes a resolver decoder for each respective resolver. For example, a hybrid vehicle includes a first motor for operation with the electric portion of the vehicle, and a second motor for operation with the combustion portion of the vehicle. The resolver associated with the first motor is coupled to a first resolver decoder, and the resolver associated with the second motor is coupled to a second resolver decoder within the common motor controller.

There are times, however, when one of the resolvers is malfunctioning and the motor controller transmits a warning to the user indicating that the motor coupled to the malfunctioning resolver is not working properly when in fact, it is the resolver decoder that is not working properly. Thus, it is often difficult to determine which of the resolver or the resolver decoder is malfunctioning when the motor controller transmits an error message.

Since replacing a motor (and resolver) or a motor controller are expensive, it is desirable to provide efficient systems and methods for testing a motor (via its resolver) and a resolver decoder coupled to the resolver to determine which of the motor/resolver and the motor controller is malfunctioning when the motor controller transmits an error message without replacing the motor or motor controller of a vehicle system (e.g., a hybrid vehicle system). Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Various exemplary embodiments of the invention provide apparatus and methods for diagnosing faults in multiple, associated motor-resolver systems. For multiple, associated motor-resolver systems including a first resolver, a second resolver, and a motor controller including a first decoder and a second decoder, one system includes a first swapping circuit selectively coupling the first resolver to the first decoder or the second decoder, and a second swapping circuit selectively coupling the second resolver to the first decoder or the second decoder.

For multiple, associated motor-resolver systems including (i) a first motor resolver that transmits a first resolver signal to a first decoder and (ii) a second motor resolver that transmits a second resolver signal to a second decoder, wherein the first and second decoders are each configured to detect fault conditions represented in the first and second resolver signals, respectively, and configured to generate a first and second fault signal, respectively, in response to detecting a fault condition, and wherein the first fault signal has been generated, one method for diagnosing faults includes the step of applying the second signal to the first decoder to determine that the first decoder is malfunctioning if the first decoder continues to generate the first fault signal. This method also includes the step of applying the first signal to the second decoder to determine that the first motor is malfunctioning if the second decoder generates the second fault signal.

One method for diagnosing faults in multiple, associated motor-resolver systems including a first motor having an associated first resolver, a second motor having a second associated resolver, and a motor controller having a first decoder and a second decoder includes the steps of transmitting a first signal from the first resolver to the first decoder and transmitting a second signal from the second resolver to the second decoder. This method also includes the steps of transmitting a third signal from the first resolver to the second decoder and transmitting a fourth signal from the second resolver to the first decoder. After the first, second, third, and fourth signals are transmitted, which of the first decoder, the second decoder, the first motor, or the second motor is malfunctioning can be determined.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
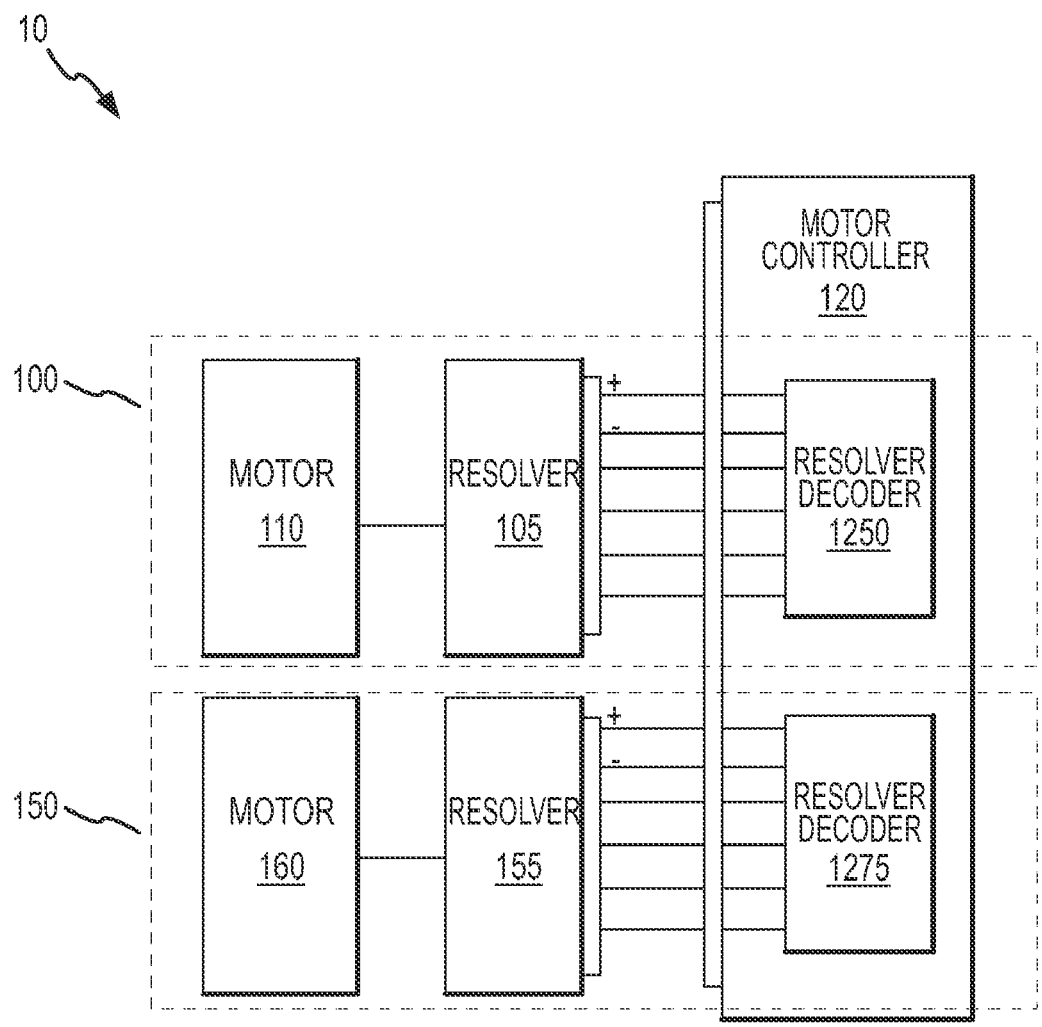
FIG. 1 is a schematic diagram of a prior art system having multiple, associated motor-resolver systems.

FIG. 1 is a schematic of a prior art system 10 including a motor-resolver system 100 and a motor-resolver system 150. Motor-resolver system 100 includes a resolver 105 coupled to a motor 110. Resolver 105 is configured to transmit signals representing the operating characteristics (e.g., motor speed, rotor angle, signal strength, connectivity, etc.) of motor 110 to a motor controller 120.

Similarly, motor-resolver system 150 includes a resolver 155 coupled to a motor 160. Resolver 155 is also configured to transmit signals representing the operating characteristics of motor 160 to motor controller 120.

Motor controller 120 includes a resolver decoder 1250 for receiving signals from resolver 105 and a resolver decoder 1275 for receiving signals from resolver 155. Resolver decoders 1250 and 1275 are each configured to monitor the operating characteristics of their respective motors (via resolvers 105 and 155) and transmit an error message when motor 110 or 160 are malfunctioning, respectively.

When malfunctioning, motor 110 and 160 may exhibit at least one of multiple possible fault conditions. One fault condition occurs when motors 110 and 160 are rotating too fast. This fault condition is referred to as a "loss of tracking" condition. A loss of tracking condition is detected by resolver decoders 1250 and 1275 when the frequency of the signals transmitted from resolver 105 and/or 155 is greater than a pre-determined threshold frequency of the signals or the resolver signal shows an exceedingly large rotational acceleration.

A "degraded signal" is another fault condition that may occur in motors 110 and 160. A degraded signal condition is detected by resolver decoders 1250 and 1275 when the peak-to-peak voltage amplitude of the signals transmitted from resolvers 105 and 155 are greater than a pre-determined threshold voltage. Since each resolver typically includes two sine wave feedback outputs and two cosine feedback outputs, the degraded signal may be found from either the sine or cosine feedback signals. Additionally, if the difference between the peak-to-peak voltage amplitudes of the sine and cosine signals is greater than a pre-determined value, the degraded signal fault may be logged by the corresponding resolver decoder.

Another fault condition that may be experienced by motors 110 and 160 is a "loss of signal" condition. A loss of signal fault condition is detected by resolver decoders 1250 and 1275 when the peak-to-peak voltage amplitude of the signals transmitted from resolvers 105 and/or 155 are less than a pre-determined threshold. Since each resolver typically includes sine wave feedback outputs and cosine feedback outputs, the loss of signal fault conditions for each resolver may be caused by the loss of signal strength in any of the feedback outputs, the extreme case being an open circuit in one or more resolver wire connections.

A "DC bias Out-Of-Range (OOR)" condition is another fault condition that may be experienced by resolvers 105 and 155. A DC bias OOR fault condition is detected when the DC bias of the signals output by the pair of sine wave feedback outputs and/or the pair of cosine wave feedback outputs is either too high or too low. A short circuit condition to the power supply or circuit ground is a typical DC bias OOR fault condition that may be experienced by resolvers 105 and 155.

Figure 2:
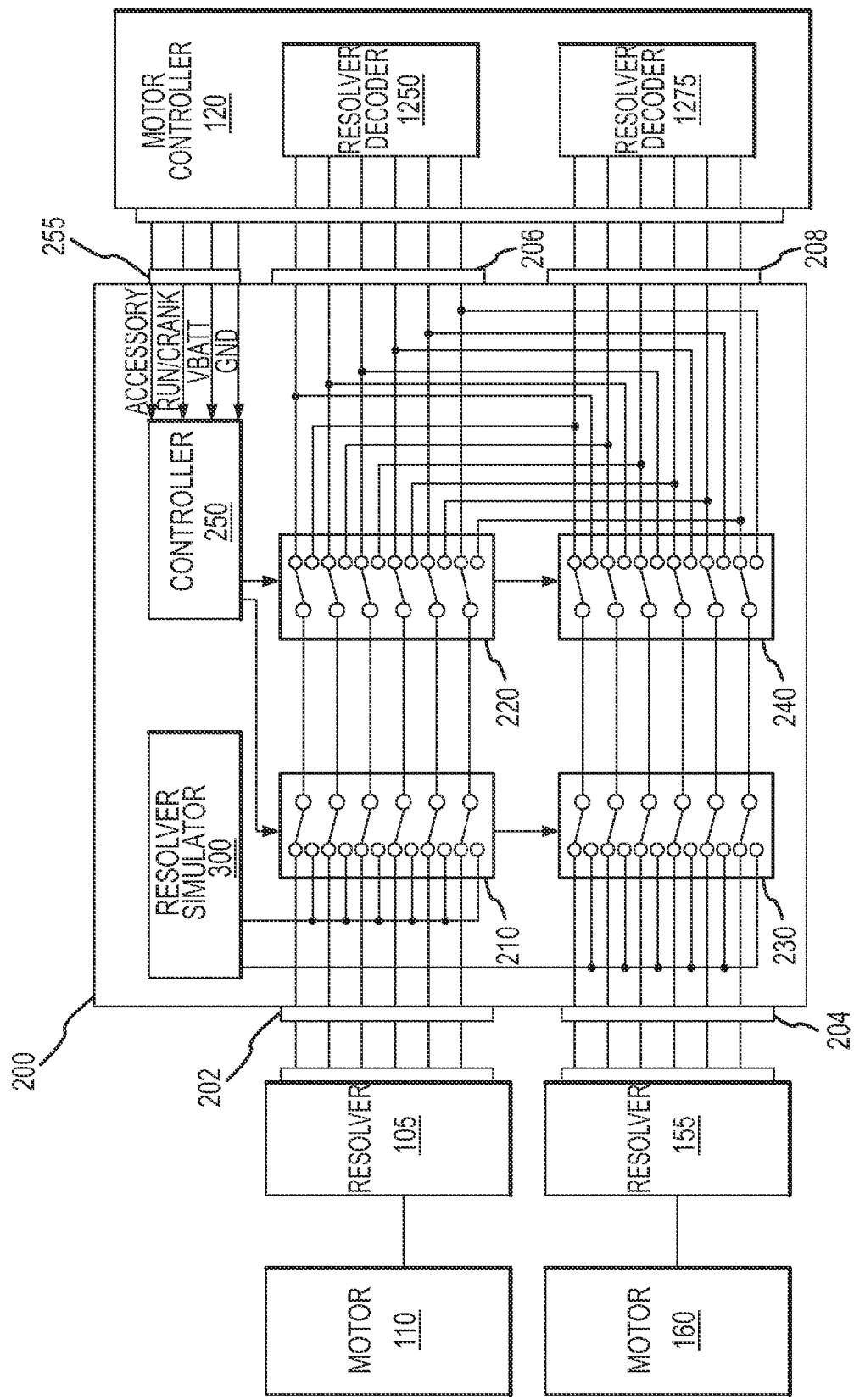
FIG. 2 is a schematic diagram of an exemplary embodiment of a device for diagnosing faults in the system of FIG. 1.

FIG. 2 is a schematic diagram of an exemplary embodiment of a device 200 for diagnosing faults in system 10. Device 200 may be inserted in, for example, a wire harness (not shown) between resolvers 105/155 and motor controller 120. Device 200 includes a connector 202, a connector 204, a connector 206, and a connector 208 to detachably couple device 200 to system 10. That is, connector 202 is configured to couple resolver 105 to device 200, connector 204 is configured to couple resolver 155 to device 200, connector 206 is configured to couple resolver decoder 1250 to device 200, and connector 208 is configured to couple resolver decoder 1275 to device 200.

Device 200 also includes a swapping circuit 210 coupled to a swapping circuit 220. Swapping circuit 210 is configured to selectively switch between being coupled to a resolver simulator 300 (see FIG. 3) and connector 202. Swapping circuit 220 is configured to selectively switch between being coupled to connector 206 and connector 208. Accordingly, resolver simulator 300 or connector 202 may be coupled to either connector 206 or connector 208. Similarly, connector 206 or connector 208 may be coupled to either resolver simulator 300 or connector 202.

Device 200 also includes a swapping circuit 230 coupled to a swapping circuit 240. Swapping circuit 230 is configured to selectively switch between being coupled to resolver simulator 300 or connector 204. Swapping circuit 240 is configured to selectively switch between being coupled to connector 206 or connector 208. Accordingly, resolver simulator 300 or connector 204 may be coupled to either connector 206 or connector 208. Similarly, connector 206 or connector 208 may be coupled to either resolver simulator 300 or connector 204.

A controller 250 coupled to swapping circuits 210, 220, 230, and 240 is also included in device 200. Controller 250 is also coupled to a connector 255 configured to detachably couple device 200 to motor controller 120.

Controller 250 is configured to operate in a plurality of modes (e.g., a run/crank mode, an accessory mode, etc.) to test (discussed below) motor 110 (via resolver 105), motor 160 (via resolver 155), resolver decoder 1250, and/or resolver decoder 1275. The accessory mode enables device 200 to "swap" between the various components of device 200. That is, controller 250 is configured to transmit a signal to swapping circuit 210, 220, 230, and/or 240 instructing one or more of these swapping circuits to switch from being coupled to one component, to being coupled to another component. For example, controller 250 may transmit a signal to swapping circuit 210 (when the vehicle key is in the accessory position, but not in the run/crank position) instructing swapping circuit 220 to switch from being coupled to connector 206 (i.e., resolver decoder 1250) to being coupled to connector 208 (i.e., resolver decoder 1275). Controller 250 may, at substantially the same time, instruct swapping circuit 230 to switch from being coupled to connector 204 (i.e., resolver 155) to being coupled to resolver simulator 300. As one skilled in the art will appreciate, controller 250 is able to transmit signals to swapping circuit 210, 220, 230, and/or 240 to enable any combination of resolver simulator 300, resolver 105, or resolver 155 to be coupled to resolver decoder 1250 or resolver decoder 1275 when operating in accessory mode.

In addition, controller 250 is configured to couple resolver simulator 300 to resolver decoder 1250 (via swapping circuits 210 and 220) and resolver decoder 1275 (via swapping circuits 230 and 240) at the same time. Here, resolver simulator 300 is capable of simulating both resolver 105 and resolver 155 to test resolver decoders 1250 and 1275 at the same time. That is, controller 250 may couple resolver 105 and resolver 155 to a respective one of resolver decoders 1250 and 1275, and then switch the coupling (via swapping circuits 220 and 240) of resolver 105 and resolver 155 to the other one of resolver decoders 1250 and 1275.

Figure 3:
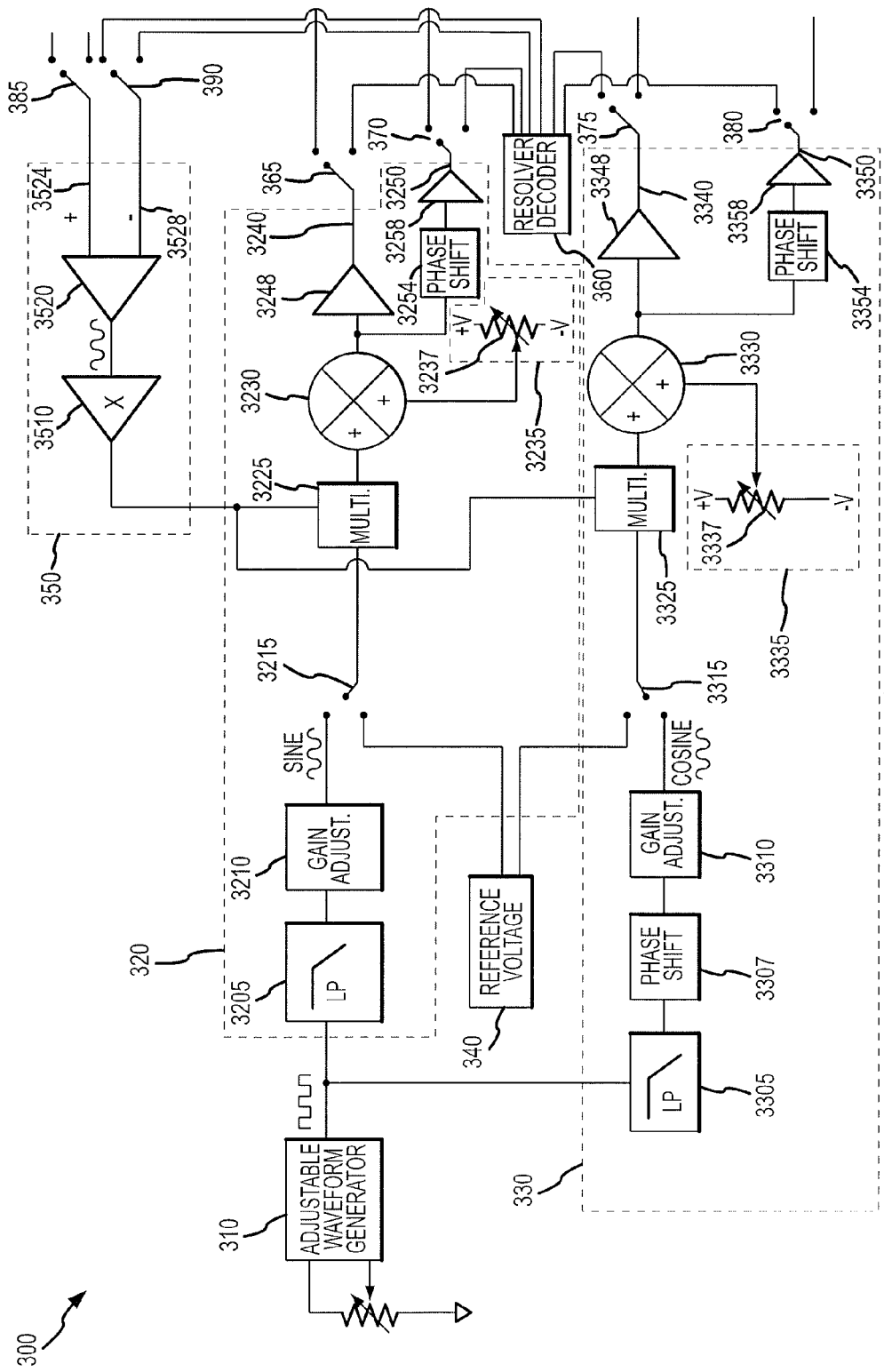
FIG. 3 is a schematic diagram of one exemplary embodiment of a resolver simulator included in the device of FIG. 2.

FIG. 3 is a schematic diagram of one exemplary embodiment of resolver simulator 300 (see FIG. 2). Resolver simulator 300 includes an adjustable waveform generator 310 configured to generate waveforms (e.g., square waves) representing an output of a motor (e.g., motor 110 or 160). Moreover, the frequency of the signals generated by waveform generator 310 may be adjusted to simulate a "loss of tracking" fault condition of a motor (i.e., the motor is rotating too fast) or normal speeds of a motor. The output of waveform generator 310 is coupled to a sine wave circuit 320 and to a cosine wave circuit 330.

Sine wave circuit 320 is configured to simulate a pair of sine wave feedback outputs of resolvers 105 and 155. To accomplish this, sine wave circuit 320 includes a low pass filter 3205 having an output coupled to a gain adjustment circuit 3310. Low pass filter 3205 and gain adjustment circuit 3310 operate to transform the square waves generated by waveform generator 310 into sine waves.

Also included in sine wave circuit 320 is a switch 3215 (e.g., a single pole, double throw (SPDT) switch) to selectively couple gain adjustment circuit 3210 or a reference voltage 340 (discussed below) to an input of signal multipilier 3225. The output of signal multiplier circuit 3225 is coupled to an adder 3230, and adder 3230 is coupled to an adjustable DC offset circuit 3235. DC offset circuit 3235 is configured to adjustably (either automatically and/or manually via, for example, a potentiometer 3237) increase or decrease the DC bias of the sine waves generated by sine wave circuit 320 to simulate a short circuit condition or a non-short circuit condition.

The output of adder 3230 is coupled to a buffer 3248 and to a phase shift circuit 3254. Buffer 3248 is configured to the amplify signals received from adder 3230, and the output of buffer 3248 is coupled to an output 3240 of sine wave circuit 320.

Phase shift circuit 3254 is configured to shift the phase of the signals received from adder 3230 by 180°, and the output of phase shift circuit 3254 is coupled to another output 3250 of sine wave circuit 320.

Cosine wave circuit 330 is configured to simulate a pair of cosine wave feedback outputs of resolvers 105 and 155. Cosine wave circuit 330 includes an output of a low pass filter 3305 coupled to a phase shift circuit 3307. The output of phase shift circuit 3307 is coupled to a gain adjustment circuit 3310. Low pass filter 3305, phase shift circuit 3307, and gain adjustment circuit 3310 operate to transform the square waves generated by waveform generator 310 into sine waves (via low pass filter 3305) and then into cosine waves (via phase shift circuit 3307).

Also included in cosine wave circuit 330 is a switch 3315 (e.g., a single pole, double throw (SPDT) switch) to selectively couple the output of gain adjustment circuit 3310 or a reference voltage 340 (discussed below) to a an input of a signal multiplier 3325.

The output of signal multiplier circuit 3325 is coupled to an adder 3330, and adder 3330 is also coupled to an adjustable DC offset circuit 3335. DC offset circuit 3335 is configured to adjustably (either automatically and/or manually via, for example, a potentiometer 3337) increase or decrease the DC bias of the cosine waves generated by cosine wave circuit 330 to simulate a short circuit condition or a non-short circuit condition.

The output of adder 3330 is coupled to a buffer 3348 and coupled to a phase shift circuit 3354. Buffer 3348 is configured to the amplify signals received from adder 3330, and the output of buffer 3348 is coupled to an output 3340 of cosine wave circuit 330.

Phase shift circuit 3354 is configured to shift the phase of the signals received from adder 3330 by 180°, and the output of phase shift circuit 3354 is coupled to another output 3350 of cosine wave circuit 330.

As discussed above, resolver simulator 300 includes a reference voltage 340 selectively coupled to signal multiplier circuit 3225 and signal multiplier circuit 3325 via switches 3215 and 3315, respectively. Reference voltage 340 operates to simulate a motor at rest (i.e., rotating at zero RPMs). Because of reference voltage 340 and waveform generator 310, resolver simulator 300 is capable of simulating motor speeds from zero RPMs to speeds greater than, for example, 13,000 RPMs. This enables resolver simulator 300 to simulate the range of speeds of motor-resolver systems 100 and 150 (see FIG. 1).

Resolver simulator 300 also includes a gain circuit 350 coupled to signal multiplier circuit 3225 and coupled to signal multiplier circuit 3325. Gain circuit 350 is configured to adjust (automatically and/or manually) the voltage amplitudes of the sine waves produced by sine wave circuit 320 and the cosine waves produced by cosine wave circuit 330. That is, gain circuit 350 is capable of adjusting the peak-to-peak voltage amplitudes of the sine waves and/or the cosine waves to simulate degraded signal fault conditions and/or loss of signal fault conditions depending upon whether the peak-to-peak amplitudes are greater than a maximum threshold voltage amplitude or less than a minimum threshold voltage amplitude. Moreover, gain circuit 350 is capable of manipulating the peak-to-peak voltage amplitudes of the sine waves and/or the cosine waves to simulate a "properly functioning" signal.

To accomplish such, gain circuit 350 includes a buffer 3510 coupled to signal multiplier circuits 3225 and 3325 discussed above. Gain circuit 350 also includes buffer 3510 coupled to a differential amplifier 3520. Moreover, differential amplifier 3520 includes a positive excitation input 3524 and a negative excitation input 3528 of resolver decoders 105 and 155 (see FIG. 1).

Resolver simulator 300 also includes a resolver decoder 360 for self-calibrating resolver simulator 300 prior to testing a motor controller (e.g., motor controller 120). Resolver decoder 360 is configured to be substantially similar to resolver decoders 1250 and 1275 (see FIG. 1). To self-calibrate resolver simulator 300, waveform generator 310, DC offset circuit 3235, DC offset circuit 3335, and gain circuit 350 are each adjusted so that resolver simulator 300 does not produce one or more fault conditions. That is, resolver simulator 300 outputs signals from sine wave circuit 320 and cosine wave circuit 330 to resolver decoder 360 representing a correctly functioning motor. Because resolver decoder 360 is substantially similar to resolver decoders 1250 and 1275, resolver simulator 300 is also calibrated for motor controller 120.

As illustrated in FIG. 3, sine wave output 3240 is selectively coupled to the input of resolver decoder 360 or one resolver decoder (e.g., resolver decoders 1250 and 1275) of motor controller 120 via a switch 365 (e.g., an SPDT switch). Similarly, sine wave output 3250 is selectively coupled to the input of resolver decoder 360 or to one resolver decoder of motor controller 120 via a switch 370 (e.g., an SPDT switch).

Cosine wave output 3340 is selectively coupled to the input of resolver decoder 360 or to one resolver decoder of motor controller 120 via a switch 375 (e.g., an SPDT switch). Furthermore, cosine wave output 3350 is selectively coupled to the input of resolver decoder 360 or to one resolver decoder of motor controller 120 via a switch 380 (e.g., an SPDT switch). That is, sine wave output 3240, sine wave output 3250, cosine wave output 3340, and cosine wave output 3350 are coupled to the input of resolver decoder 360 when resolver simulator 300 is being self-calibrated, and coupled to either resolver decoder 1250 or 1275 when resolver simulator 300 is testing resolver decoder 1250 or 1275, respectively.

In addition, positive excitation input 3524 is selectively coupled to the output of resolver decoder 360 or the output of one resolver decoder of motor controller 120 via a switch 385 (e.g., an SPDT switch). Negative excitation input 3528 is selectively coupled to the output of resolver decoder 360 or the output of one resolver decoder of motor controller 120 via a switch 390 (e.g., an SPDT switch). That is, positive excitation input 3524 and negative excitation input 3528 are coupled to the output of resolver decoder 360 when resolver simulator 300 is being self-calibrated, and coupled to the output of either resolver decoder 1250 or 1275 when resolver simulator 300 is testing resolver decoder 1250 or 1275, respectively.

During an exemplary operational mode, various inputs to resolver simulator 300 may be manually and/or automatically adjusted to simulate one or more of the fault conditions discussed above or a properly operating condition to determine if the motor controller (e.g., motor controller 120) is functioning properly. For example, the frequency of signals produced by waveform generator 310 may be increased so that the outputs of sine wave output 3240, sine wave output 3250, cosine wave output 3340, and/or cosine wave output 3350 simulate a loss of tracking fault condition. In another example, the DC bias of the outputs of sine wave output 3240 and sine wave output 3250, and/or cosine wave output 3340 and cosine wave output 3350 may be adjusted to be too high or too low to simulate a short circuit fault condition. Furthermore, the voltage gain produced by gain circuit 350 may be increased or decreased so that the peak-to-peak voltage amplitude of the outputs of sine wave output 3240, sine wave output 3250, cosine wave output 3340, and/or cosine wave output 3350 are less than or greater than a pre-determined threshold to simulate a loss of signal or degraded signal fault condition, respectively. In addition, the outputs may include a frequency, DC bias, and peak-to-peak voltage simulating a properly functioning motor-resolver system. Accordingly, resolver simulator 300 is capable of simulating the multiple fault conditions discussed above with reference to motor-resolver systems 100 and 150, as well as a properly functioning motor-resolver system.

Figure 4:
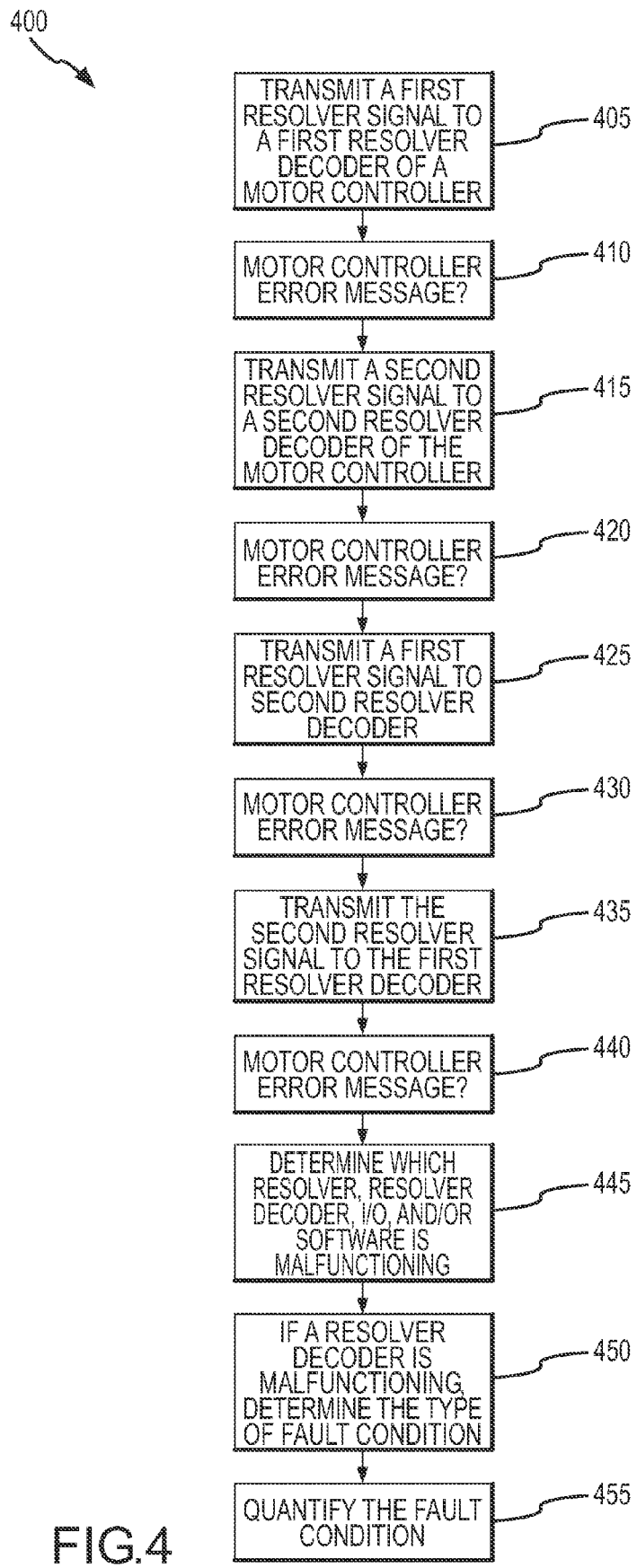
FIG. 4 is a flow diagram representing one exemplary embodiment of a method for diagnosing faults in the system of FIG. 1.

FIG. 4 is a flow diagram representing one exemplary embodiment of a method 400 for testing system 10. After system 10 is coupled to device 200 (e.g., resolver 105 is coupled to connector 202, resolver 155 is coupled to connector 204, resolver decoder 1250 is coupled to connector 206, and resolver decoder 1275 is coupled to connector 208), resolver 105 is coupled to resolver decoder 1250 via, for example, swapping circuits 210 and 220. A signal from resolver 105 is transmitted to resolver decoder 1250 (step 405) to determine if motor controller 120 transmits an error message in response to the signal from resolver 105 (step 410).

Resolver 155 is coupled to resolver decoder 1275 via, for example, swapping circuits 230 and 240. A signal from resolver 155 is transmitted to resolver decoder 1275 (step 415) to determine if motor controller 120 transmits an error message in response to the signal from resolver 155 (step 420).

Resolver 105 is also coupled to resolver decoder 1275 via, for example, swapping circuits 210 and 220. A signal from resolver 105 is transmitted to resolver decoder 1275 (step 425) to determine if motor controller 120 transmits an error message in response to the signal from resolver 105 (step 430). Similarly, resolver 155 is also coupled to resolver decoder 1250 via, for example, swapping circuits 230 and 240. A signal from resolver 155 is transmitted to resolver decoder 1250 (step 435) to determine if motor controller 120 transmits an error message in response to the signal from resolver 155 (step 440).

Once steps 405 through 440 have been performed, it can be determined which of resolver 105, resolver 155, resolver decoder 1250, resolver decoder 1275, and/or an input/output (I/O) or software of motor controller 120 is malfunctioning (step 445). Resolver 105 and/or 155 is malfunctioning if motor controller 120 transmits an error message that "jumps" from one decoder to the other decoder when motor controller 120 receives signals from resolver 105 or 155, respectively.

For example, if motor controller 120 transmits an error message when resolver decoder 1250 is receiving signals from resolver 105 (via swapping circuits 210 and 220), and also transmits an error message when resolver decoder 1275 is receiving signals from resolver 105 (after swapping circuit 220 connects to resolver decoder 1275), resolver 105 is malfunctioning. In another example, if motor controller 120 transmits an error message when resolver decoder 1275 is receiving signals from resolver 155 (via swapping circuits 230 and 240), and also transmits an error message when resolver decoder 1250 is receiving signals from resolver 155 (after swapping circuit 240 connects to resolver decoder 1275), resolver 155 is malfunctioning.

Resolver decoder 1250 or 1275 (or an I/O or software of motor controller 120) is malfunctioning if motor controller 120 transmits an error message that fails to "jump" from one resolver decoder to the other resolver decoder when resolver decoders 1250 and 1275 receive signals from resolvers 105 and 155, respectively. For example, if motor controller 120 transmits an error message when resolver decoder 1250 is receiving signals from resolver 105 (via swapping circuits 210 and 220), and continues to transmit an error message when resolver decoder 1250 is receiving signals from resolver 155 (via swapping circuits 230 and 240), resolver decoder 1250 is malfunctioning. Likewise, if motor controller 120 transmits an error message when resolver decoder 1275 is receiving signals from resolver 105 (via swapping circuits 210 and 220), and continues to transmit an error message when resolver decoder 1275 is receiving signals from resolver 155 (via swapping circuits 230 and 240), resolver decoder 1275 is malfunctioning. If resolver 105, resolver 155, resolver decoder 1250, and resolver decoder 1275 are each functioning properly, but motor controller 120 continues to transmit an error signal, an I/O or the software of motor controller 120 is malfunctioning.

When resolver decoder 1250 or 1275 is malfunctioning, the type of malfunction resolver decoder 1250 or 1275 is experiencing can be determined (step 450). That is, resolver simulator 300 (and swapping circuits 210 and 230, as controlled by controller 250) may be used to identify which faulty condition(s) resolver decoder 1250 or 1275 is experiencing.

To determine if the malfunction resolver decoder 1250 or 1275 is experiencing is associated with detection of a loss of tracking fault condition, resolver simulator 300 (after being coupled to resolver decoder 1250 or 1275) transmits one or more signals simulating a motor rate of speed. The speed may then be increased (either instantaneously or gradually) to simulate an acceleration that is too large or a rate of speed greater than a maximum threshold speed to determine if motor controller transmits an error message in response thereto. If motor controller 120 transmits an error message in response to the simulated speed being greater than the maximum threshold speed, resolver decoder 1250 or 1275 is not experiencing a malfunction associated with detecting a loss of tracking fault condition. Alternatively, if motor controller 120 fails to transmit an error message in response to the simulated speed being greater than the maximum threshold speed, resolver decoder 1250 or 1275 is experiencing a malfunction associated with detecting a loss of tracking fault condition.

In determining if the malfunction resolver decoder 1250 or 1275 is experiencing is associated with detection of a degraded signal fault condition, resolver simulator 300 transmits one or more signals simulating a resolver peak-to-peak voltage amplitude. The voltage of the simulated signals may initially simulate a properly functioning resolver. The voltage may then be increased (either instantaneously or gradually) to simulate a peak-to-peak voltage greater than a maximum threshold voltage to determine if motor controller transmits an error message in response to the simulated voltage being greater than the maximum threshold voltage. If motor controller 120 transmits an error message in response to the simulated voltage being greater than the maximum threshold voltage, resolver decoder 1250 or 1275 is not experiencing a malfunction associated with detecting a degraded signal fault condition. Alternatively, if motor controller 120 fails to transmit an error message in response to the simulated voltage being greater than the maximum threshold voltage, resolver decoder 1250 or 1275 is experiencing a malfunction associated with detecting a degraded signal fault condition.

To determine if the malfunction resolver decoder 1250 or 1275 is experiencing is associated with detection of a loss of signal fault condition, resolver simulator 300 transmits one or more signals simulating a resolver peak-to-peak voltage amplitude. The voltage of the simulated signals may initially be within the range of voltages simulating a properly functioning resolver. The voltage may then be decreased (either instantaneously or gradually) to simulate a peak-to-peak voltage less than a minimum threshold voltage to determine if motor controller transmits an error message in response to the simulated voltage being less than the minimum threshold voltage. If motor controller 120 transmits an error message in response to the simulated voltage being less than the minimum threshold voltage, resolver decoder 1250 or 1275 is not experiencing a malfunction associated with detecting a loss of signal fault condition. Alternatively, if motor controller 120 fails to transmit an error message in response to the simulated voltage being less than the minimum threshold voltage, resolver decoder 1250 or 1275 is experiencing a malfunction associated with detecting a loss of signal fault condition.

In determining if the malfunction resolver decoder 1250 or 1275 is experiencing is associated with detection of a DC bias OOR fault condition, resolver simulator 300 transmits one or more signals simulating a resolver DC bias. The DC bias of the simulated signals may initially be within a range of DC biases simulating a properly functioning resolver. The DC bias may then be increased (either instantaneously or gradually) and/or decreased (either instantaneously or gradually) to simulate a DC bias that is either greater than a maximum threshold DC bias or a DC bias that is below a minimum threshold DC bias to determine if motor controller transmits an error message in response thereto. If motor controller 120 transmits an error message in response to the simulated DC bias being greater than the maximum threshold DC bias and/ or (depending upon whether testing one of or both of the maximum and minimum DC bias threshold(s)) being less than the minimum threshold DC bias, resolver decoder 1250 or 1275 is not experiencing a malfunction associated with detecting a DC bias OOR fault condition. Alternatively, if motor controller 120 fails to transmit an error message in response to the simulated DC bias being greater than the maximum threshold DC bias and/or (depending upon whether testing one of or both of the maximum and minimum DC bias threshold(s)) being less than the minimum threshold DC bias, resolver decoder 1250 or 1275 is experiencing a malfunction associated with detecting a DC bias OOR fault condition.

After the type of malfunction is determined, the magnitude of the malfunction can be quantified (step 455). The magnitude of the malfunction may be quantified by determining a threshold motor speed (for a loss of tracking fault condition), a threshold peak-to-peak voltage (for a loss of signal fault condition or a degraded signal condition), or a DC bias threshold (for a DC bias OOR fault condition).

The threshold motor speed is the motor speed at which motor controller 120 transmits the error message in response to signals from resolver simulator 300. To determine the threshold motor speed when a loss of tracking fault condition exists, waveform generator 310 (see FIG. 3) may be adjusted (either gradually or instantaneously) so that resolver simulator 300 outputs signals simulating varying motor speeds until motor controller 120 transmits the error signal. The simulated motor speed may be started at a speed representing a properly functioning resolver signal or a speed representing the loss of tracking fault condition. The threshold motor speed may then be compared to the motor speed at which motor controller 120 should transmit the error message to quantify the loss of tracking fault condition.

The threshold peak-to-peak voltage is the voltage at which at which motor controller 120 transmits the error message in response to signals from resolver simulator 300. In determining the threshold peak-to-peak voltage when a degraded signal fault condition exists, gain circuit 350 (see FIG. 3) may be adjusted (either gradually or instantaneously) so that resolver simulator 300 outputs signals simulating varying peak-to-peak voltages until motor controller 120 transmits the error signal. The simulated peak-to-peak voltages may be started at a voltage representing a properly functioning resolver signal or a voltage representing the degraded signal fault condition. The threshold voltage may then be compared to the voltage at which motor controller 120 should transmit the error message to quantify the degraded signal fault condition. Similarly, gain circuit 350 may be adjusted (either gradually or instantaneously) so that resolver simulator 300 outputs signals simulating varying peak-to-peak voltages to determine the threshold peak-to-peak voltage when a loss of signal fault condition exists.

The threshold DC bias is the DC bias at which at which motor controller 120 transmits the error message in response to signals from resolver simulator 300. In determining the threshold DC bias when a DC bias OOR fault condition exists, DC offset circuit 3235 and/or DC offset circuit 3335 (see FIG. 3) may be adjusted (either gradually or instantaneously) so that resolver simulator 300 outputs signals simulating varying DC biases until motor controller 120 transmits the error signal. The simulated DC biases may be started at a DC bias representing a properly functioning resolver signal or a DC bias representing the short circuit fault condition. The threshold DC bias may then be compared to the DC bias at which motor controller 120 should transmit the error message to quantify the short circuit fault condition.

Sometimes when a malfunction exists in system 10, which of motor-resolver systems 100 and 150 has the problem is known. However, whether the malfunction is on the motor side or the motor controller side is unknown. For example, if a malfunction exists in system 10, it may be known that the malfunction is within motor-resolver system 100, however; whether resolver 105 or resolver decoder 1250 is the malfunctioning component is unknown. In another example, if a malfunction exists in system 10, it may be known that the malfunction is within motor-resolver system 150, however; whether resolver 155 or resolver decoder 1275 is the malfunctioning component is unknown.

Figure 5:
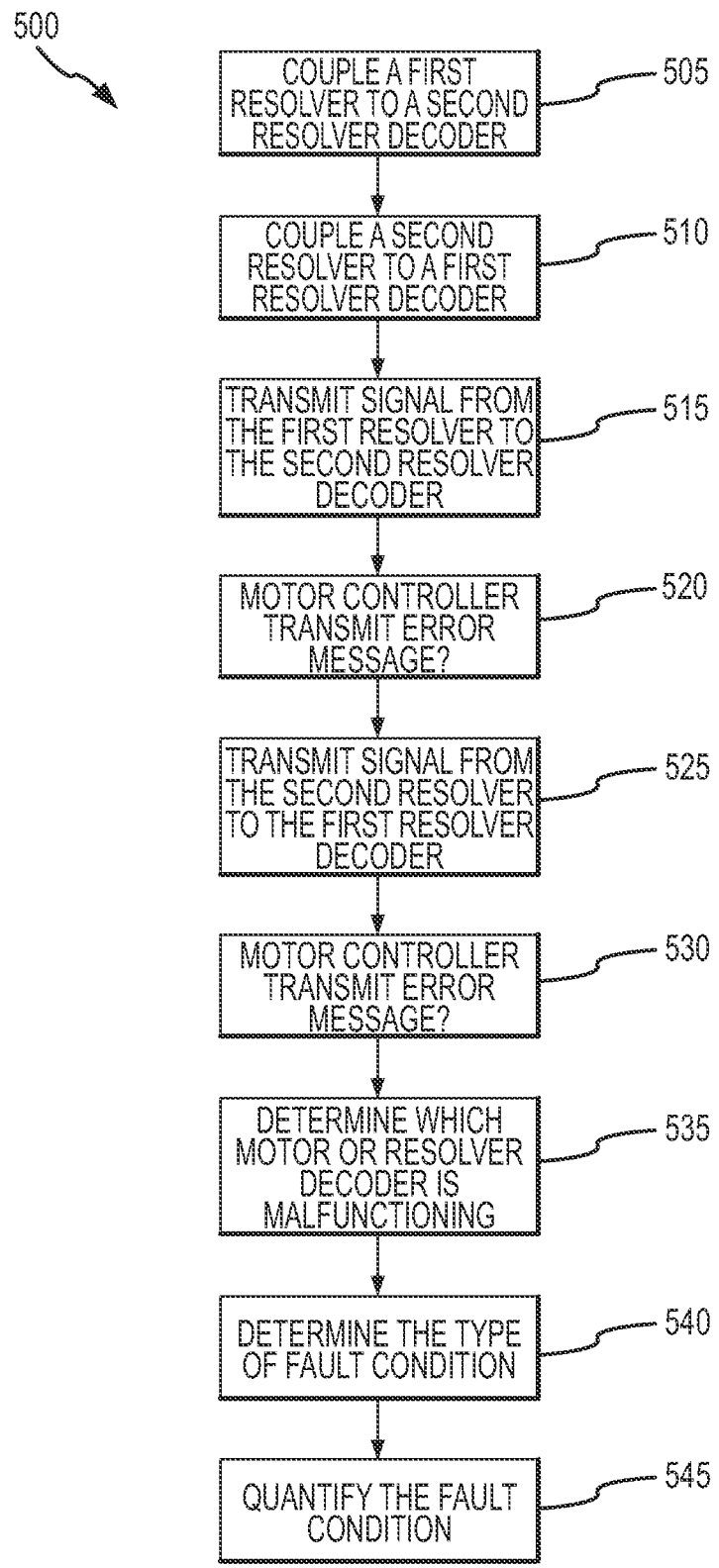
FIG. 5 is a flow diagram representing another exemplary embodiment of a method for diagnosing faults in the system of FIG. 1.

FIG. 5 is a flow diagram representing one exemplary embodiment of a method 500 for diagnosing faults in system 10 when it is known that the malfunction is in motor-resolver system 100 or motor-resolver system 150. Method 500 begins by coupling a resolver (e.g., resolver 105) to a resolver decoder (e.g., resolver decoder 1275) (step 505), and coupling another resolver (e.g., resolver 155) to another resolver decoder (e.g., resolver decoder 1250) (step 510). A signal is transmitted from resolver 105 to resolver decoder 1275 (step 515) to determine if the motor controller (e.g., motor controller 120) transmits an error message (step 520). A signal is also transmitted from resolver 155 to resolver decoder 1250 (step 525) to determine motor controller 120 transmits an error message (step 530).

Once steps 505 through 525 have been performed, which motor controller or resolver decoder is malfunctioning can be determined (step 535). If the error message transmitted by motor controller 120 "jumps" from one resolver decoder to the other resolver decoder, the motor is malfunctioning. If the error message fails to jump from one resolver decoder to the other resolver decoder (i.e., stays at the same resolver decoder), the resolver decoder is malfunctioning. For example, if it is known that motor-resolver system 100 is malfunctioning, after resolver 105 transmits a signal to resolver decoder 1275 and resolver 155 transmits a signal to resolver decoder 1250, if controller 120 transmits the error message from resolver decoder 1275, resolver 105 is malfunctioning. If controller 120 transmits the error message from resolver decoder 1250, resolver decoder 1250 is malfunctioning. In an example when it is known that motor-resolver system 150 is malfunctioning, if controller 120 transmits the error message from resolver decoder 1250, resolver 155 is malfunctioning; but if controller 120 transmits the error message from resolver decoder 1275, resolver decoder 1275 is malfunctioning.

When resolver decoder 1250 or 1275 is malfunctioning, which of the multiple fault conditions resolver decoder 1250 or 1275 is experiencing can be determined in a manner similar to step 450 discussed above with respect to FIG. 4 (step 540). Furthermore, once the type of fault condition is determined, the magnitude of the fault condition(s) can be determined in a manner similar to step 455 discussed above with respect to FIG. 4 (step 545).

Figure 6:
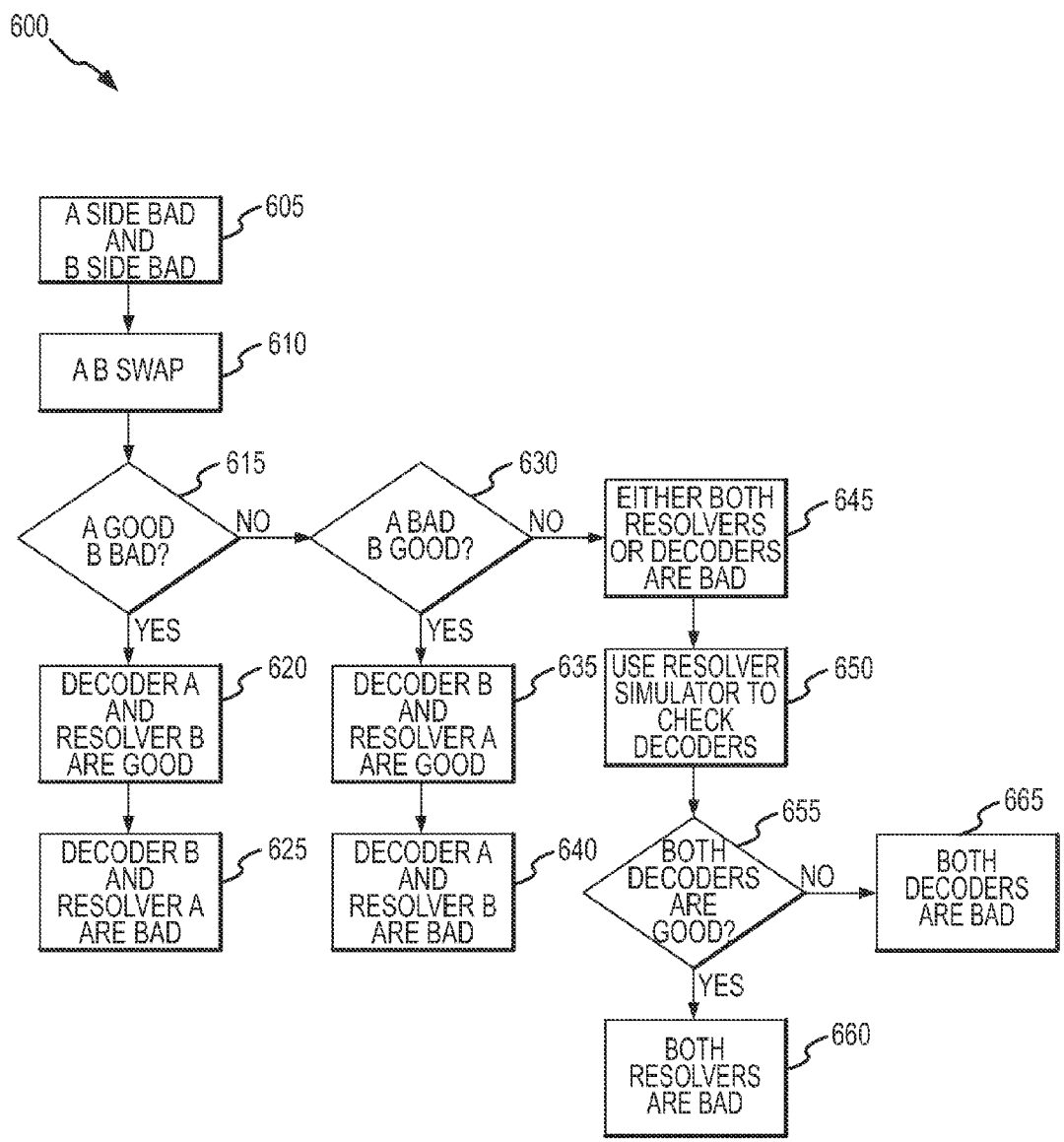
FIG. 6 is a flow diagram representing yet another exemplary embodiment of a method for diagnosing faults in the system of FIG. 1.

FIG. 6 is a flow diagram representing one exemplary embodiment of a method 600 for diagnosing faults in system 10. Method 600 begins by knowing that a motor controller (e.g., motor controller 120) indicates that side A (e.g., motor-resolver system 100 in FIG. 1) and side B (e.g., motor-resolver system 150 in FIG. 1) of system 10 are malfunctioning (i.e., are "bad" ) (step 605).

Method 600 also includes connecting system 10 to device 200 and swapping (via swapping circuits 220 and 240) the coupling of sides A and B (step 610). That is, for example, coupling resolver 105 to decoder resolver 1275 and coupling resolver 155 to resolver decoder 1250 when resolver 105 was initially coupled to resolver decoder 1250 and resolver 155 was initially coupled to resolver decoder 1275.

Side A is checked to determine if it is functioning properly (i.e., if it is "good") and side B is checked to determine if it is malfunctioning or bad (step 615). If side A is functioning properly and side B is malfunctioning, decoder A (e.g., resolver decoder 1250) and resolver B (e.g., resolver 155) are determined to be functioning properly (i.e., are "good") (step 620), and decoder B (e.g., resolver decoder 1275) and resolver A (e.g., resolver 105) are determined to be malfunctioning (i.e., are "bad") (step 625).

Side A is checked to determine if it is malfunctioning and side B is checked to determine if it is functioning properly (step 630). If side A is malfunctioning and side B is functioning properly, decoder B (e.g., resolver decoder 1275) and resolver A (e.g., resolver 105) are determined to be functioning properly (i.e., are "good") (step 635), and decoder A (e.g., resolver decoder 1250) and resolver B (e.g., resolver 155) are determined to be malfunctioning (i.e., are "bad") (step 640).

If the answer to both steps 615 and 630 are NO, it is determined that resolvers A and B, or decoders A and B are both malfunctioning (step 645). In this situation, a resolver simulator (e.g., resolver simulator 300) is used to check decoders A and B (step 650) to determine if decoders A and B are both functioning properly (step 655). If decoders A and B are functioning properly, resolvers A and B are both malfunctioning (step 660); otherwise, decoders A and B are both malfunctioning (step 665).

While at least one exemplary embodiment has been presented in the foregoing detailed description of the invention, it should be appreciated that a vast number of variations exist and that the method steps described with reference to FIGS. 4 and 5 may be performed in any order and/or one or more steps may be omitted. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

We claim:

1. A system for diagnosing faults in multiple, associated motor-resolver systems including a first resolver, a second resolver, and a motor controller including a first decoder and a second decoder, the system comprising:
    a first swapping circuit selectively coupling the first resolver to one of the first decoder and the second decoder;
    a second swapping circuit selectively coupling the second resolver to one of the first decoder and the second decoder, wherein the first and second swapping circuits are configured such that:
        when the first resolver is coupled to the first decoder, the second resolver is coupled to the second decoder, and
        when the first resolver is coupled to the second decoder, the second resolver is coupled to the first decoder; and
    a controller coupled to the first swapping circuit and the second swapping circuit, the controller configured to:
        provide a first signal to the first swapping circuit to switch from being coupled to the first decoder to being coupled to the second decoder at a first time; and
        provide a second signal to the second swapping circuit to switch from being coupled to the second decoder to being coupled to the first decoder at a second point in time, the second time being approximately equal to the first time.

2. The system of claim 1, further comprising:
    an adjustable resolver simulator configured to generate outputs simulating at least one resolver fault condition of a plurality of resolver fault conditions; and
    a third swapping circuit selectively coupling one of the resolver simulator and the first resolver to the first swapping circuit.

3. The system of claim 2, further comprising a fourth swapping circuit selectively coupling one of the resolver simulator and the second resolver to the second swapping circuit.

4. The system of claim 1, further comprising:
an adjustable resolver simulator configured to generate outputs simulating at least one resolver fault condition of a plurality of resolver fault conditions; and
a third swapping circuit selectively coupling one of the resolver simulator and the second resolver to the second swapping circuit.

5. A method for diagnosing faults in multiple, associated motor-resolver systems including (i) a first motor resolver that transmits a first resolver signal to a first decoder and (ii) a second motor resolver that transmits a second resolver signal to a second decoder, wherein the first and second decoders are each configured to detect fault conditions represented in the first and second resolver signals, respectively, and configured to generate a first and second fault signal, respectively, in response to detecting a fault condition, and wherein the first fault signal has been generated, the method comprising the steps of:
applying the second signal to the first decoder to determine that the first decoder is malfunctioning if the first decoder continues to generate the first fault signal; and
applying the first signal to the second decoder to determine that the first motor is malfunctioning if the second decoder generates the second fault signal.

6. The method of claim 5, wherein the first decoder includes a malfunction, the method further comprising the step of determining a type of the fault condition causing the malfunction.

7. The method of claim 6, further comprising the step of quantifying a threshold of the fault condition.

8. The method of claim 7, wherein the quantifying step comprises the steps of:
transmitting a plurality of signals simulating varying rates of speeds to the first decoder; and
identifying a rate of speed that causes the motor controller to transmit the first fault signal in response to the plurality of signals.

9. The method of claim 7, wherein the quantifying step comprises the steps of:
transmitting a plurality of signals simulating varying DC biases; and
identifying a DC bias that causes the motor controller to transmit the first fault signal in response to the plurality of signals.

10. The method of claim 7, wherein the quantifying step comprises the steps of:
transmitting a plurality of signals simulating varying peak-to-peak voltage amplitudes greater than a maximum threshold voltage; and
identifying a voltage that causes the motor controller to transmit the error message in response to the plurality of signals.

11. The method of claim 7, wherein the quantifying step comprises the steps of:
transmitting a plurality of signals simulating varying peak-to-peak voltage amplitudes less than a minimum threshold voltage; and
identifying a voltage that causes the motor controller to transmit the error message in response to the plurality of signals.

12. A method for diagnosing faults in multiple, associated motor-resolver systems including a first motor having an associated first resolver, a second motor having an associated second resolver, and a motor controller having a first decoder and a second decoder, the method comprising the steps of:
transmitting a first signal from the first resolver to the first decoder;
transmitting a second signal from the second resolver to the second decoder;
transmitting a third signal from the first resolver to the second decoder;
transmitting a fourth signal from the second resolver to the first decoder; and
determining if one of the first decoder, the second decoder, the first motor, and the second motor is malfunctioning, wherein the determining step comprises the steps of:
determining if the motor controller transmits an error message in response to one of the first signal and the second signal; and
determining if the motor controller transmits the error message in response to one of the third signal and the fourth signal.

13. The method of claim 12, the method further comprising the steps of:
determining that the first motor is malfunctioning if the motor controller transmits the error message in response to both the first signal and the third signal;
determining that the second motor is malfunctioning if the motor controller transmits the error message in response to both the second signal and the fourth signal.

14. The method of claim 12, further comprising the steps of:
determining that the first decoder is malfunctioning if the motor controller transmits the error message in response to both the first signal and the fourth signal; and
determining that the second decoder is malfunctioning if the motor controller transmits the error message in response to both the second signal and the third signal.

15. The method of claim 14, wherein one of the first decoder and the second decoder includes a malfunction, the method further comprising the step of determining a type of fault condition causing the malfunction from a group of fault conditions comprised of a loss of tracking fault condition, a loss of signal fault condition, a short circuit fault condition, and a degraded signal fault condition.

16. The method of claim 15, further comprising the step of quantifying a threshold of the one of the loss of tracking fault condition, the loss of signal fault condition, the degraded signal fault condition, and the short circuit fault condition.

17. The method of claim 16, wherein the quantifying step comprises the steps of:
transmitting a plurality of signals simulating varying rates of speeds to the first decoder; and
identifying a rate of speed that causes the motor controller to transmit the error message in response to the plurality of signals.

18. The method of claim 16, wherein the quantifying step comprises the steps of:
transmitting a plurality of signals simulating varying DC biases; and
identifying a DC bias that causes the motor controller to transmit the error message in response to the plurality of signals.

19. The method of claim 16, wherein the quantifying step comprises the steps of:
transmitting a plurality of signals simulating varying peak-to-peak voltage amplitudes one of greater than a maximum threshold voltage and less than a minimum threshold voltage; and
identifying a voltage that causes the motor controller to transmit the error message in response to the plurality signals.

* * * * *